United States Patent [19]
Yano et al.

[11] Patent Number: 5,569,628
[45] Date of Patent: Oct. 29, 1996

[54] SEMICONDUCTOR DEVICE FABRICATION METHOD

[75] Inventors: Kousaku Yano; Tomoyasu Murakami; Masayuki Endo, all of Osaka; Noboru Nomura, Kyoto, all of Japan

[73] Assignee: Matsushita Electric Industrial Co., Ltd., Osaka, Japan

[21] Appl. No.: 535,323

[22] Filed: Sep. 27, 1995

Related U.S. Application Data

[63] Continuation of Ser. No. 186,178, Jan. 25, 1994, abandoned.

[30] Foreign Application Priority Data

Jan. 25, 1993 [JP] Japan ..................... 5-010070

[51] Int. Cl.$^6$ ................................. H01L 21/465
[52] U.S. Cl. ................ 437/245; 437/228; 437/246; 437/190; 437/192; 437/195
[58] Field of Search ..................... 437/190, 192, 437/195, 245, 246, 228 ST

[56] References Cited

U.S. PATENT DOCUMENTS 5,312,776  5/1994  Murakami .................. 437/19

FOREIGN PATENT DOCUMENTS 0116149  6/1985  Japan.
0149423  6/1989  Japan.
0046731  2/1990  Japan.
0073953  3/1992  Japan.

*Primary Examiner*—Trung Dang
*Attorney, Agent, or Firm*—McDermott, Will & Emery

[57] ABSTRACT

A silicon dioxide film is partly etched away to form an opening thereby exposing a silicon substrate. The surface of the opening, which is almost entirely covered with Si-OH, is coated with hexamethyldisilazane (HMDS) to bring about a silylation reaction. This causes the silicon substrate surface to be covered with a molecular film formed by replacing the hydrogen part in Si-OH with $Si((CH_3)_3)$. Atoms of aluminum are ejected by a sputtering process. The ejected aluminum atoms collide with the molecular film. Although some hydrocarbons ($CH_x$) are sputtered or ejected due to such collision, a $SiO_xC_yH_z$ film 12' transformed from the molecular film is left between an aluminum film deposited and the silicon substrate. This $SiO_xC_yH_z$ film 12' acts as a barrier metal. The presence of the $SiO_xC_yH_z$ film prevents the occurrence of counter diffusion in the Al-Si system. No spikes are formed as a result.

13 Claims, 9 Drawing Sheets

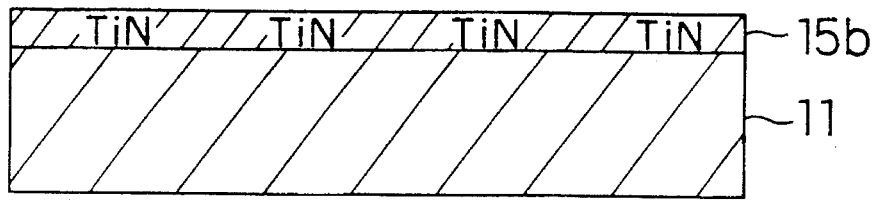
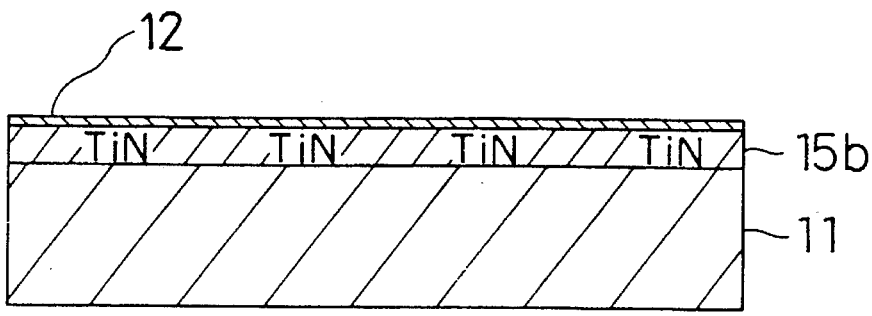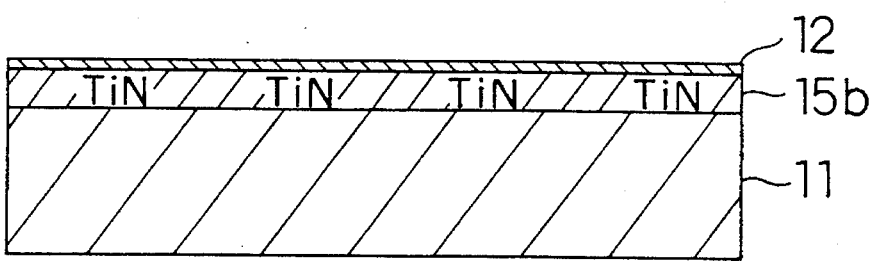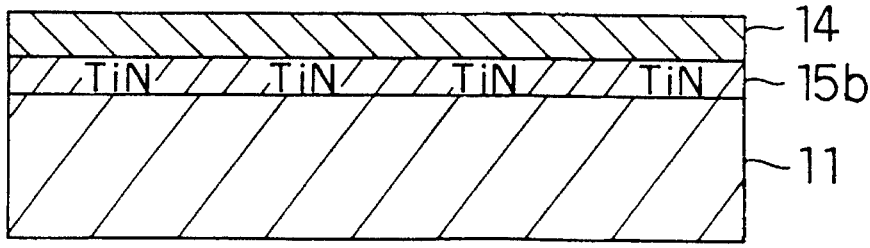

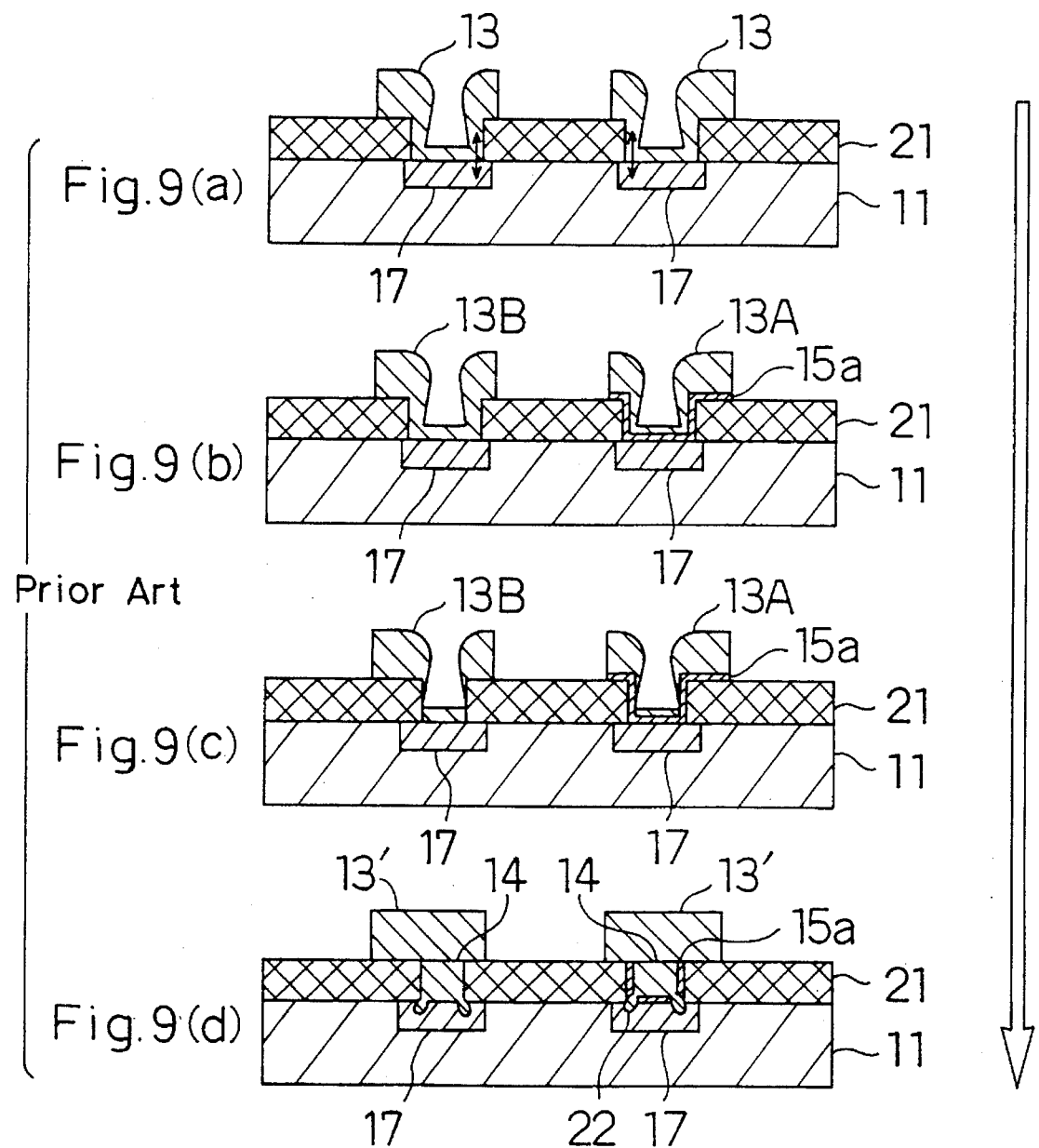

SEMICONDUCTOR DEVICE FABRICATION METHOD

This is a continuation application of application Ser. No. 08/186,178 filed Jan. 25, 1994, now abandoned.

TECHNICAL FIELD OF THE INVENTION

This invention pertains to a method of fabricating semiconductor devices.

BACKGROUND OF THE INVENTION

Aluminum and its alloys have been used extensively as wiring materials. In other words, they are used to connect components in a semiconductor device. This is because they have many advantages such as low contact resistance, low wiring resistance, good process ability, and availability at reasonable cost, over any other metal.

Various phenomena occur when silicon comes in contact with metal. More specifically, they occur at the contact portion (hereinafter called a contact) between a silicon substrate and a metal wire.

Several of these phenomena are explained, along with the development in LSIs, by making reference to FIGS. 9(a) to 9(d).

As shown in these figures, the scale of integration of semiconductor devices has increased and the device dimensions have decreased.

FIG. 9(a) illustrates one of the early semiconductor devices in which contacts are squares of several micrometers by several micrometers. The semiconductor device of FIG. 9(a) comprises a silicon (Si) substrate 11, a source/drain diffusion region 17, an insulating film 21 which is a planarized film of silicate, and a metal wire 13 which is pure aluminum. The pure aluminum wiring improves controllability because the sputtering process for aluminum wiring involves only aluminum atoms. Also, when an aluminum wiring film deposited is etched by a dry etching process into a desired wiring pattern, good controllability is obtainable, since what is required is only the reaction of aluminum with aluminum chloride.

The above-described pure-aluminum metallization, however, produces a problem, that is, the occurrence of counter diffusion in the aluminum-silicon system. If such counter diffusion takes place, aluminum atoms will enter deep into a silicon diffusion region thereby creating aluminum spikes. Due to the occurrence of aluminum spiking, the metal wire 13 and the silicon substrate 11 may short-circuit. This is one of the causes of defective semiconductors.

Many of the up-to-date semiconductor devices use an organization, shown in FIG. 9(b), in order to eliminate aluminum spikes. FIG. 9(b) shows two different contact organizations. One, on the left side of the figure, is a metal wire 13B which is aluminum that contains several percent of silicon. The other, on the right side, is characterized in that a barrier metal 15a is sandwiched between a metal wire 13A which is pure aluminum and the silicon substrate 11.

In the case of the silicon-containing aluminum wiring type, as in the metal wire 13B, the solid solubility of silicon in aluminum is below 1% at temperatures not exceeding several hundred degrees centrigrade. No diffusion from the silicon substrate 11 into the aluminum occurs, and the occurrence of spiking is prevented. In the case of the barrier metal type, a film of titanium nitride (TIN) having a film thickness of about 100 nanometers is used to serve as the barrier metal 15a. In high-melting-point metal type materials such as TiN, their inter-lattice gap is so small that no aluminum atoms can make their way through it. Therefore, the occurrence of counter diffusion in the Al-Si system is restrained whereby the occurrence of spiking is prevented.

The silicon-containing aluminum wiring type, however, has a problem that an excess of silicon is expelled from the metal wire 13B. Such expelled silicon is likely to build up at the interface between the metal wire 13B and the semiconductor substrate 11. Particularly, for the case of approximately 1 μm×1 μm contacts, they will be entirely covered with the expelled silicon. In the case of $n^+$-type diffusion regions, the silicon, expelled and built up at a contact, slightly contains aluminum so that it exhibits a p-type characteristic. Generally, ohmic contact is formed between a diffusion region and a metal wire. If a p-type silicon is inserted between a diffusion region of $n^+$-type and the metal wire 13B, however, this breaks the ohmic contact formation. The contact resistance between the $n^+$-type diffusion region and the metal wire 13B becomes greater, and thus the characteristic of transistors degrades dramatically.

In the case of the barrier metal type organization, on the left side of FIG. 9(b), it is necessary to carry out an extra sputtering process to deposit the barrier metal 15a before the deposition of aluminum by a later sputtering process. This requires extra equipment.

There is a common problem to both of these two types. As the dimensions of the contacts decrease, the step coverage of the aluminum films formed by a sputtering process at the contact dramatically drops. An example of such a drop in step coverage is shown in FIG. 9(c). In this example, a 1 μm-thick aluminum film is deposited by a sputtering process on a semiconductor device having contact holes (hole size: 1 μm×1 μm, depth: 1 μm). The aspect ratio (i.e., depth/width of holes) is 1:1 here. The deposited aluminum has a very thin film thickness at the bottom of the contact hole, below one-tenth of the film thickness at the other locations (i.e., below 0.1 μm thick). If electric current flows through such a thin wiring portion, disconnection, due to heat developed by the increase in resistance, may take place.

An improved semiconductor structure of FIG. 9(d) has been proposed with the aim of providing a solution to the above-described problem of FIG. 9(c). FIG. 9(d) shows two different contact formation techniques, both of which employs a CVD (chemical vapor deposition) process that utilizes a gas of $WF_6$. In a CVD process, films can be deposited with good step coverage even at a step as well as at the bottom of a contact hole, since the chemical reaction of the source gas mainly occurs on the surface of a semiconductor substrate. The barrier metal 15a is a film of TiN having a film thickness of about 100 nanometers. An aluminum metal wire is indicated by reference numeral 13'.

In one of the two contact formation techniques shown in FIG. 9(d), a tungsten (W) film 14 is selectively deposited by a selective CVD process so that the tungsten film 14 is deposited only on top of a contact portion. In the other of the two contact formation techniques, on the other hand, a film of TiN is formed all over the silicon substrate 11 and the insulating film 21. This is followed by the deposition of a tungsten film by means of a blanket CVD process. Then, the deposited W and TiN films are etched to obtain electrical contact. The barrier metal 15a, comprised of the tungsten film 14 and the TiN film, is left in a contact hole.

These two contact formation techniques can prevent metal films from becoming thin, since the contact hole is filled with the tungsten film 14.

Both the selective CVD process and the blanket CVD process make use of a gas of $WF_6$ as a source gas. Tungsten is deposited as follows.

$$WF_6 + 3H_2 \rightarrow W + 6HF \tag{1}$$

$$5WF_6 + 6SiH_4 \rightarrow 5W + 24HF + 6SiF \tag{2}$$

As seen from the chemical formula (2), $WF_6$ easily reacts with silicon. Because of such a chemical reaction, the TiN film becomes thin during the selective or the blanket CVD process and the following chemical reaction will occur if the silicon in an underlying film is exposed.

$$WF_6 + 6Si \rightarrow W + 6SiF \tag{3}$$

This replaces the silicon with the tungsten thereby creating tungsten encroachments and wormholes on the diffusion region 17. As a result, the same problems as accompanied with the occurrence of spiking arise.

As described above, use of aluminum in metallization results in the formation of spikes. Additionally, when filling a contact hole with a tungsten film, the tungsten reacts with the silicon in the diffusion region. As a result, the tungsten enters into the diffusion region causing short-circuiting between the silicon substrate and an electrode.

These problems occur not only when forming a metal film, of aluminum or tungsten, on a semiconductor substrate but also when forming a metal film on metal wiring formed on or over a semiconductor substrate.

SUMMARY OF THE INVENTION

Bearing in mind the above-described issues or problems accompanied with the prior art techniques described above, the present invention was made. Therefore, it is an object of the present invention to provide a way of preventing unwanted phenomena or problems such as spiking, encroachment, and wormholes from taking place when forming a metal film on metal wiring arranged on or over a semiconductor substrate. This is done by the prevention of a chemical reaction of the metal film with the semiconductor substrate or with the metal wire.

The present invention provides a first semiconductor device fabrication method. The first method comprises the steps of:

(a) forming a molecular film containing silicon on a semiconductor substrate composed of silicon, and (b) depositing on the silicon-containing molecular film a metal film comprised of a metal.

If a metal in the metal film has a property of causing counter diffusion with respect to the silicon in the semiconductor substrate, then the molecular film formed on the semiconductor substrate acts as a barrier film. As a result, the occurrence of counter diffusion between the metal in question and the silicon in the semiconductor substrate can be prevented. Further, if a metal in the metal film has a property of being replaced by the silicon in the semiconductor substrate, then the molecular film formed on the semiconductor substrate acts as a barrier film so that no replacement reactions of the metal in question with the silicon in the semiconductor substrate will take place.

The first semiconductor device fabrication method is able to prevent the metal in the metal film from penetrating the silicon in the semiconductor substrate, while at the same time preventing encroachment/wormholes from developing on the surface of the semiconductor substrate.

The first semiconductor device fabrication method may further comprise the steps of:

depositing another metal film, composed of a metal different from the metal forming the metal film deposited by the metal film deposition step (b), on the silicon substrate prior to the molecular film formation step (a), and patterning the molecular film by illuminating it with high-energy beams between the molecular film formation step (a) and the metal film deposition step (b), wherein the metal film deposition step (b) includes: supplying a gas containing a metal over the silicon substrate; and chemically reacting the metal in the gas with the patterned molecular film so that the metal film is deposited on only the patterned molecular film.

The molecular film, since it is loosely bonded to the semiconductor substrate, can be removed easily when exposed to high-energy light beams. This makes it easy to pattern the molecular film using high-energy light beams. The metal-containing gas is introduced over the patterned molecular film. The metal contained in the gas does not react with any other metal in the semiconductor substrate; however, it does react with the silicon in the molecular film so as to selectively form a metal film only on the patterned molecular film. This allows for a selective metal film deposition to be performed.

The present invention provides a second semiconductor device fabrication method. The second method comprises the steps of:

forming an insulating film on a semiconductor substrate composed of silicon, forming an opening in the insulating film by etching a part of the insulating film, thereby exposing a corresponding part of the semiconductor substrate, forming a molecular film containing silicon on the exposed part of the semiconductor substrate at the opening, and depositing a metal film on the molecular film.

The second semiconductor device fabrication method is able to prevent the metal in the metal film from penetrating the silicon in the semiconductor substrate while at the same time preventing encroachment/wormholes from developing on the surface of the semiconductor substrate.

In the second method, the metal film deposition step may include: supplying a gas containing a metallic compound; and chemically reacting an element, joined to a metal in the metallic compound, with the silicon in the molecular film so as to deposit a metal film composed of the metal on the exposed part of the semiconductor substrate at the opening.

The molecular film acts as a sacrificial film capable of preventing the silicon from reacting with the aforesaid elements. This ensures that unwanted phenomena including spiking, encroachment, and wormholes will not occur, even when forming a metal film by supplying metallic compounds.

Even if the metal film is aluminum, the formation of spikes can be prevented without fail, although counter diffusion is most likely to take place in the aluminum-silicon system.

Even in cases where the metal film is tungsten, no replacement reaction of the silicon in the substrate with the tungsten in the metal film will occur, although tungsten is most likely to be replaced by silicon.

The present invention provides a third semiconductor device fabrication method. This third method comprises the steps of:

depositing a first metal film composed of a first metal on a semiconductor device composed of silicon, forming a molecular film containing silicon on the first metal film, and depositing a second metal film composed of a second metal on the first metal film by supplying a gas containing a metallic compound of the second metal over the first metal film, and by chemical reacting an element, joined to the second metal, with the silicon in the molecular film.

The element joined to the second metal does react with the silicon in the molecular film so that it (the element) will not react with the silicon in the semiconductor substrate even if the first metal film formed on the substrate is thin. Therefore, the occurrence of encroachment/wormholes can be prevented.

In the third method, the first metal film deposition step may include forming the first metal film on the semiconductor substrate formed on a surface of which is an insulating film having openings.

As a result of such an arrangement, although the first metal film, when formed on the insulating film, is likely to have a greater film thickness at the bottom of the opening, the reaction of the element joined to the second metal with the silicon in the semiconductor can be prevented and thus, encroachment/wormholes will not occur at the bottom of the opening.

In the third semiconductor device fabrication method, the first metal may be titanium or titanium nitride, and the second metal may be tungsten.

The present invention provides a fourth semiconductor device fabrication method. The fourth method comprises the steps of:

forming metal wiring composed of a first metal on a semiconductor substrate, forming an insulating film on the metal wiring, forming an opening in the insulating film by etching a part of the insulating film, thereby a corresponding part of the metal wiring being exposed at said opening, forming a molecular film containing silicon on the exposed part of the metal wiring at the opening, and depositing a second metal film composed of a second metal on the exposed part of the metal wiring at the opening by supplying a gas containing a metallic compound of the second metal to the opening, and by chemically reacting an element, joined to the second metal, with the silicon in the molecular film.

The element joined to the second metal reacts with the silicon in the semiconductor substrate, thereby not reacting with the first metal to produce chemical compounds having insulating properties. Good inter-metal connection is obtainable between the metal wiring and the metal film.

In the fourth semiconductor device fabrication method, the first and second metals may be aluminum and tungsten, respectively.

The present invention provides a fifth semiconductor device fabrication method. The fifth method comprises the steps of:

forming metal wiring composed of a first metal on a semiconductor substrate, forming an insulating film on the metal wiring, forming an opening in the insulating film by etching a part of the insulating film, thereby exposing a corresponding part of the metal wiring at the opening, depositing a first metal film composed of a second metal on the exposed part of the metal wiring at the opening, forming a molecular film containing silicon on the first metal film, and depositing a second metal film composed of a third metal on the first metal film by supplying a gas containing a metallic compound of the third metal to the opening, and by chemically reacting an element, joined to the third metal, with the silicon in the molecular film.

The element that is being joined to the third metal reacts with the silicon in the semiconductor substrate, thereby not reacting with the first metal to produce chemical compounds having insulating properties, although the first metal film becomes thinner at the bottom of the opening. Good inter-metal connection is obtainable between the metal wiring and the overlying metal film.

In the fifth semiconductor device fabrication method, the first, second, and third metals may be aluminum, titanium, and tungsten, respectively.

BRIEF DESCRIPTION OF THE DRAWINGS

FIGS. 4(a) to 4(d) are schematic cross sectional views, illustrating the steps in the fabrication of a semiconductor device according to a fourth example of the present invention.

FIGS. 9(a) to 9(d) are schematic cross sectional views, illustrating the steps in the fabrication of a semiconductor device according to a conventional technique.

DETAILED DESCRIPTION OF THE INVENTION

Preferred examples of the present invention are now described below by making reference to the drawings.

EXAMPLE 1

As described previously, the use of aluminum in metallization (i.e., the aluminum metallization) creates spikes in a silicon substrate. FIGS. 1(a) to 1(d) shows one way to minimize the aluminum spiking.

Figure 1A:
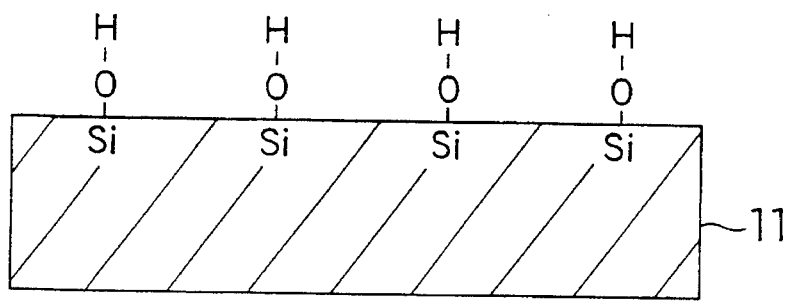
FIGS. 1(a) to 1(d) are schematic cross sectional views, illustrating the steps in the fabrication of a semiconductor device according to a first example of the present invention.
Figure 1B:
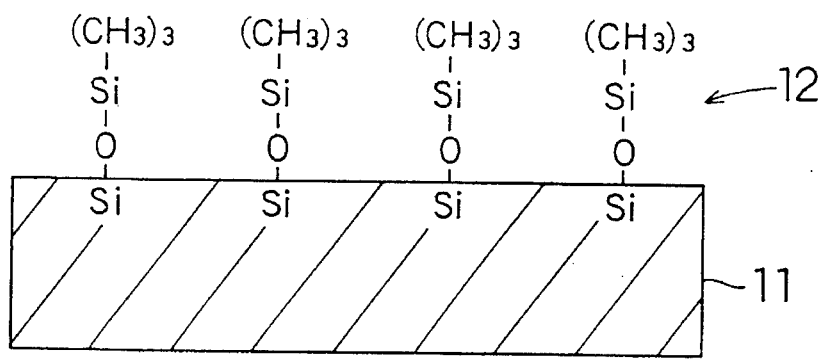

A diffusion region of the silicon substrate 11 is oxidized for the growth of a film of silicon dioxide. The grown silicon dioxide film is partly etched away to form an opening thereby exposing the silicon substrate 11. The opening surface, which has been almost entirely covered with Si-OH as shown in FIG. 1(a), is coated with hexamethyldisilazane (HMDS) (($Si(CH_3)_3)_2NH$)) or the like for silylation. This causes a surface of the silicon substrate 11 to be covered with a molecular film 12 formed by replacing the hydrogen part in Si-OH with $Si((CH_3)_3$ (see FIG. 1(b)).

Figure 1C:
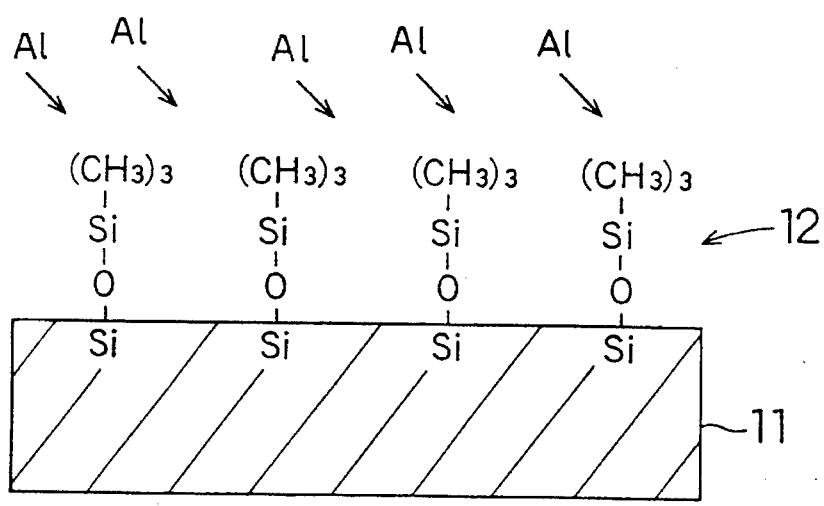
Figure 1D:
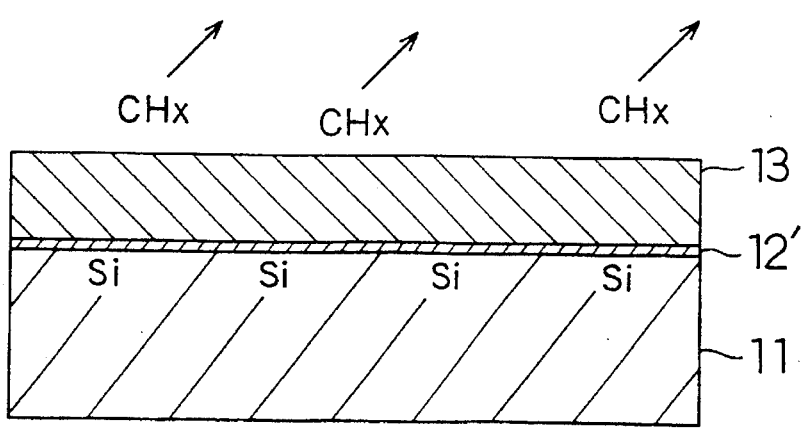

Next, as shown in FIG. 1(c), atoms of aluminum are ejected by a sputtering process. The ejected aluminum atoms collide with the molecular film 12. Although some hydrocarbons ($CH_x$) are sputtered or ejected due to such collision, a $SiO_xC_yH_z$ film 12' transformed from the molecular film 12 is left between an aluminum film 13 deposited and the silicon substrate 11 (see FIG. 1(d)). This $SiO_xC_yH_z$ film 12' acts as a barrier metal. The presence of the $SiO_xC_yH_z$ film 12' prevents the occurrence of counter diffusion in the Al-Si system. No spikes are formed as a result.

In this case, the $SiO_xC_yH_z$ film 12' can be deposited ranging from 0.5 to 1.0 nanometer. As a result of the $SiO_xC_yH_z$ film 12' being deposited 1.0 nanometer or less, there is little or no increase in electric resistance. The present example, therefore, is applicable to semiconductor devices with 0.5 μm or more design rules.

If a Ti or TiN underlying film becomes thin in a selective or a blanket CVD process, then this causes the silicon in the silicon substrate's 11 diffusion region to be replaced with the tungsten. In other words, the tungsten results in the occurrence of spikes in the diffusion region. One way to restrain the occurrence of encroachment or wormholes will be described below.

EXAMPLE 2

FIGS. 2(a) to 2(d) shows one technique to prevent the occurrence of encroachment/wormholes in a selective CVD process.

Figure 2A:
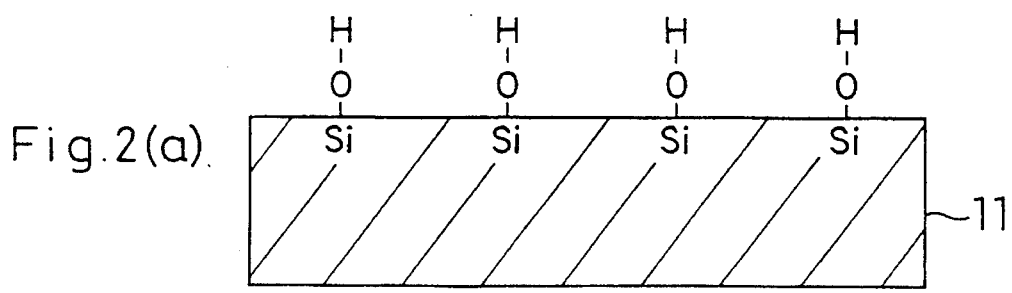
FIGS. 2(a) to 2(d) are schematic cross sectional views, illustrating the steps in the fabrication of a semiconductor device according to a second example of the present invention.
Figure 2B:
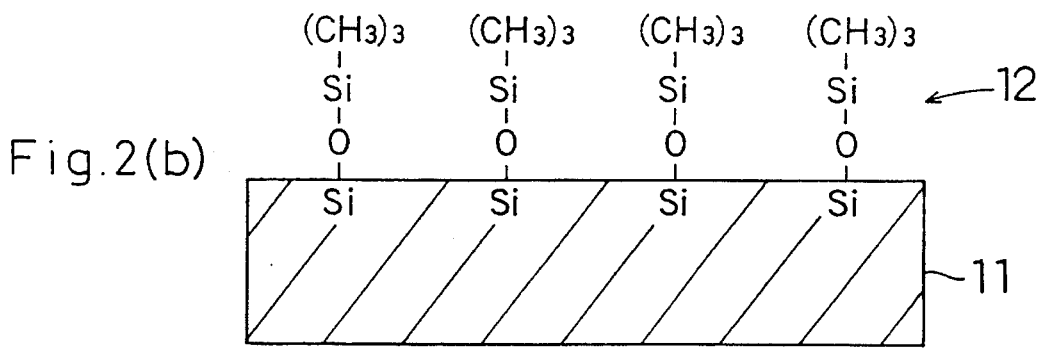

A diffusion region of the silicon substrate 11 is oxidized for the growth of a film of silicon dioxide. The grown silicon dioxide film is partly etched away to form an opening thereby exposing the silicon substrate 11. The opening surface, which is almost entirely covered with Si-OH as shown in FIG. 2(a), is coated, for example, with HMDS for silylation. This causes a surface of the silicon substrate 11 to be covered with the molecular film 12 formed by a silylation reaction replacing the hydrogen part in Si-OH with $Si((CH_3)_3$ (see FIG. 2(b)).

Figure 2C:
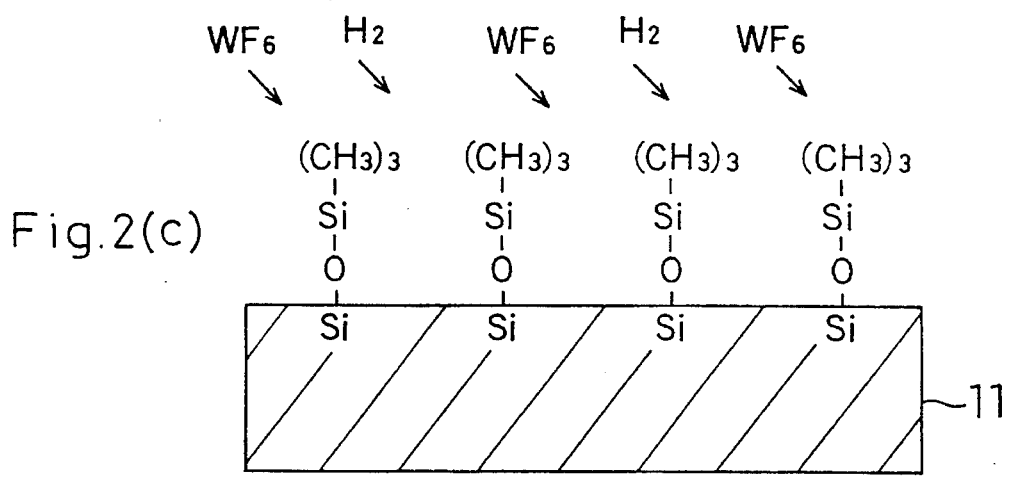
Figure 2D:
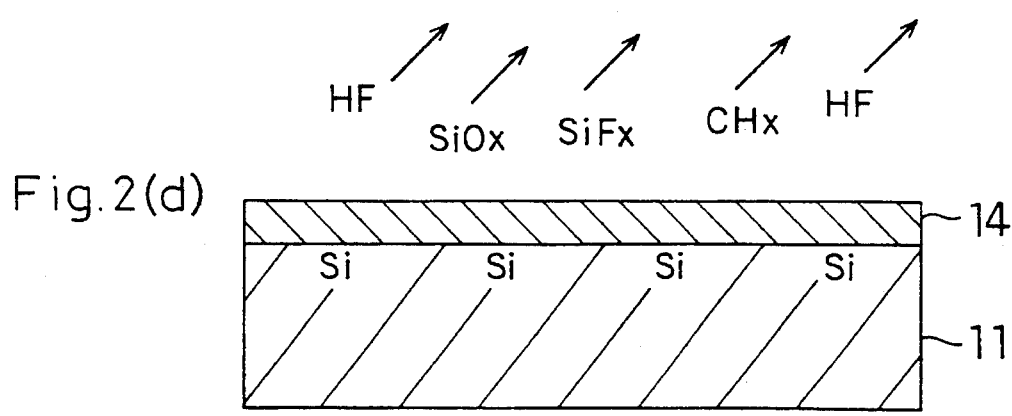

A metal-containing gaseous mixture of $WF_6$ and $H_2$, of $WF_6$ and $SiH_4$, or of $WF_6$, $SiH_4$, and $H_2$ is introduced over the molecular film 12 (see FIG. 2(c)). This, as shown in FIG. 2(d), deposits the tungsten film 14 on top of the silicon substrate 11.

In the case of the conventional technique, the following chemical reaction takes place.

$$WF_6+Si(substrate)\rightarrow W+SiF_x \qquad (4)$$

According to the conventional techniques, the $WF_6$ in the gas reacts with the Si in the silicon substrate 11. This creates encroachment or wormholes.

Conversely, in the present example, the silicon substrate 11 is covered with $Si(CH_3)_3$ (see FIG. 2(c)) so that the following chemical reaction will take place at the arrival of the $WF_6$ gas, thereby depositing the tungsten film 14 on top of the silicon substrate 11.

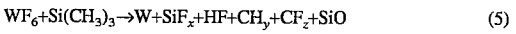

$$WF_6+Si(CH_3)_3\rightarrow W+SiF_x+HF+CH_y+CF_z+SiO \qquad (5)$$

All the other substances excluding W (tungsten) on the right side of the chemical reaction formula (5) are all volatile so that they are removed in the form of gas. As shown in the formula (5), the molecular film 12 contains many elements capable of reacting with the $WF_6$. In other words, the molecular film 12 acts as a sacrificial film thereby performing the function of preventing the $WF_6$ gas from reacting with the silicon in the silicon substrate 11 (see FIG. 2(d)). The occurrence of encroachment/wormholes is prevented as a result.

In the case of depositing a tungsten film all over the silicon substrate 11, it is better for a Ti or TiN film to be deposited on the substrate 11 prior to the tungsten film deposition if the dimensions of contact holes are very small, for ease of producing $TiSi_2$ at the Ti (or TiN) film/silicon substrate interface. This reduces the contact resistance of the Ti (or TiN) film against the silicon substrate 11 and also reduces the contact resistance of the tungsten film deposited against the silicon substrate 11.

Both the Ti film and the TiN film have a thickness of several tens of nanometers so that they become thinner when influenced by dust particles or at the bottom of a deep contact hole. This may result in exposing the underlying silicon substrate 11. As in the forgoing selective CVD process, encroachment/wormholes may occur due to the reaction of the $WF_6$ gas with the silicon in the silicon substrate 11.

EXAMPLE 3

Referring now to FIGS. 3(a) to 3(d), one technique is shown for the prevention of encroachment/wormholes in a blanket CVD process for depositing a W film on a Ti film overlying the silicon substrate 11.

Figure 3A:
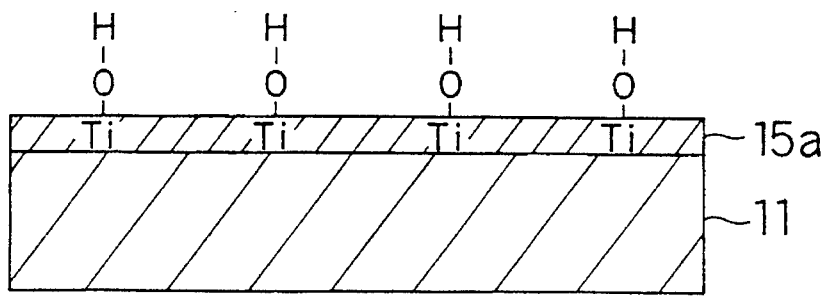
FIGS. 3(a) to 3(d) are schematic cross sectional views, illustrating the steps in the fabrication of a semiconductor device according to a third example of the present invention.
Figure 3B:
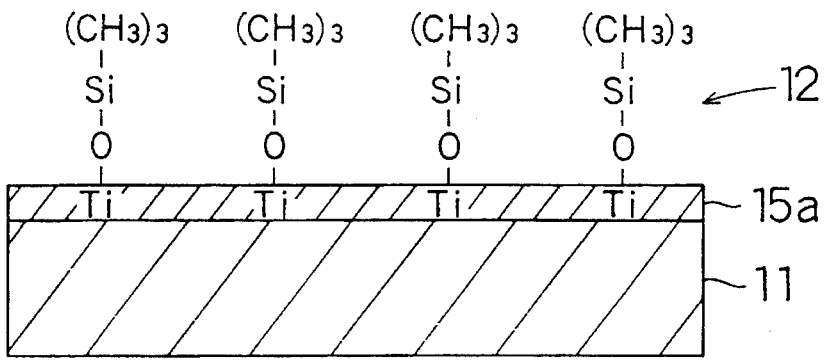

As shown in FIG. 3(a), a Ti film 15a, formed on the silicon substrate 11, is covered with TiOH. HMDS or the like is applied to the Ti film 15a for silylation. As shown in FIG. 3(b), the molecular film 12 of $TiOSi(CH_3)_3$ is formed.

Figure 3C:
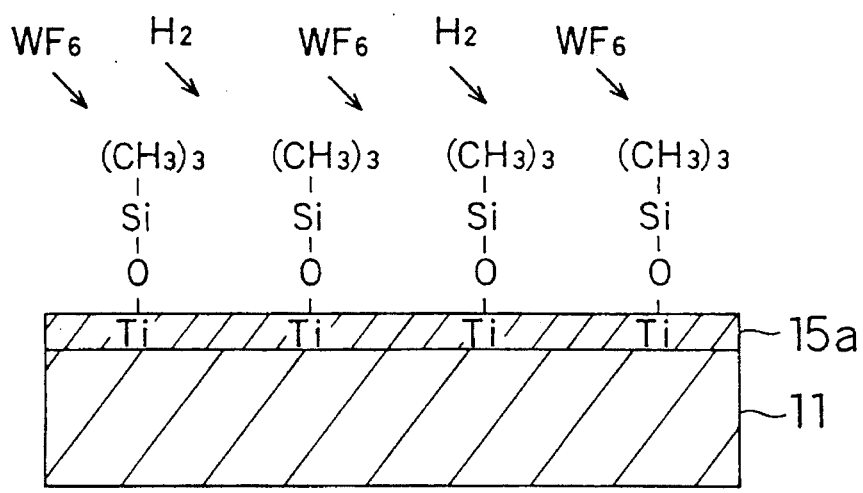
Figure 3D:
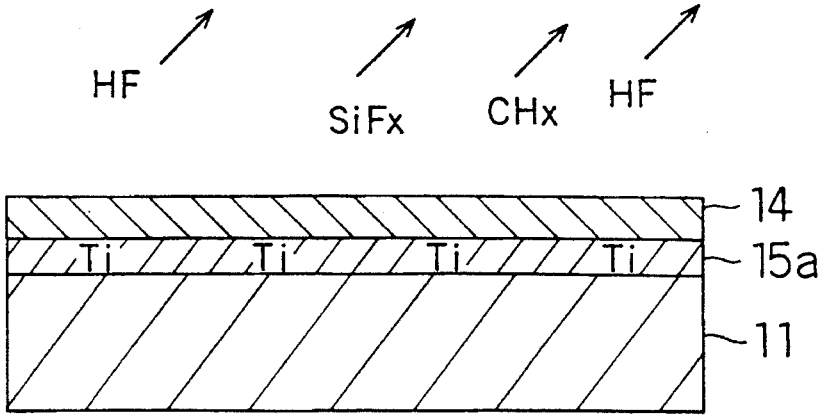

The arrival of $WF_6$ gas, shown in FIG. 3(c), forms the tungsten film 14 on top of the silicon substrate 11 (see FIG. 3(d)). The molecular film 12 contains many elements that react with the $WF_6$ gas, thereby acting as a sacrificial film described previously, so that the reaction of the $WF_6$ gas with the silicon in the silicon substrate 11 will not occur at all. This prevents encroachment/wormholes from taking place.

EXAMPLE 4

Referring now to FIGS. 4(a) to 4(d), one technique is shown for the prevention of encroachment/wormholes in a blanket CVD process for depositing a W film on a TiN film overlying the silicon substrate 11. The TiN film is a high-density film so that it hardly undergoes micro-cracking. This almost perfectly prevents the tungsten film 14 from chemically reacting with the silicon substrate 11. This is the reason why the TiN film is used instead of using the aforesaid Ti film.

As shown in FIG. 4(a), a TiN film 15b, formed on the silicon substrate 11, is covered with TiOH. HMDS or the like is applied to the TiN film 15b for silylation. As shown in FIG. 4(b), the molecular film 12 of $(Si(CH_3)_3)_2NH$ is formed on the silicon substrate 11.

The arrival of $WF_6$ gas, shown in FIG. 4(c), forms the tungsten film 14 on top of the silicon substrate 11 (see FIG. 4(d)). The molecular film 12 contains many elements that react with the $WF_6$ gas, thereby acting as a sacrificial film described previously, so that the reaction of the $WF_6$ gas with the silicon in the silicon substrate 11 will not occur at all. This prevents encroachment/wormholes from taking place.

MODIFICATIONS OF EXAMPLES 2–4

In Examples 2 to 4, the tungsten film 14 acts as a contact portion with respect to the silicon substrate 11. These examples, however, may find applications in multi-level metallization. For example, they may be useful when depositing, for example, a tungsten film on aluminum wiring formed on the silicon substrate.

In the case of aluminum wiring formed by pure aluminum or by aluminum with a content of Si, Cu, Ti, or Pd, neither encroachment nor wormholes occurs. However, if a gas of $WF_6$ comes in contact with the aluminum in the aluminum wire, this may produce Al-F compounds. With such compounds electrical disconnection will occur between an aluminum wire and a tungsten film although the wire and the film are in a connection relationship with each other.

To establish good electrical connection, an aluminum wire is pre-coated with a molecular film which contains elements that react with $WF_6$. As a result, when $WF_6$ is introduced, it reacts with the silicon in the molecular film. This suppresses the formation of Al-F compounds thereby ensuring a good electrical connection.

More specifically, aluminum wiring is performed on the silicon substrate 11. Then, the aluminum wiring is partly etched away to form an opening, thereby exposing the silicon substrate 11. HMDS or the like is directly applied to the opening or to a Ti or TiN film formed on the opening so as to form a molecular film. A gas of $WF_6$ is introduced to react with the silicon in the molecular film and a film of tungsten is formed on the aluminum wire.

EXAMPLE 5

FIGS. 5(a) to 5(d) describe a semiconductor device fabrication technique in which a molecular film is patterned beforehand and a thin film is deposited only on the patterned molecular film.

Figure 5A:
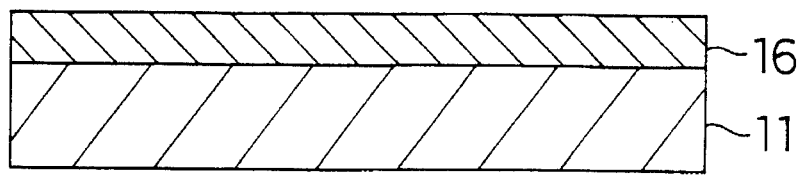
FIGS. 5(a) to 5(e) are schematic cross sectional views, illustrating the steps in the fabrication of a semiconductor device according to a fifth example of the present invention.
Figure 5B:
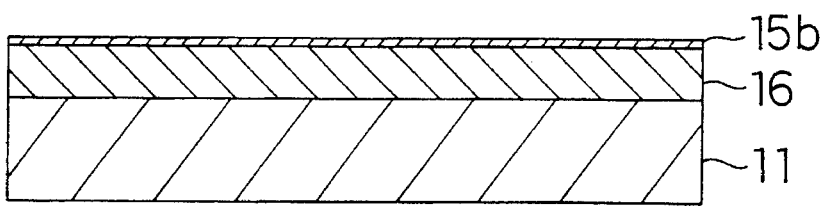
Figure 5C:
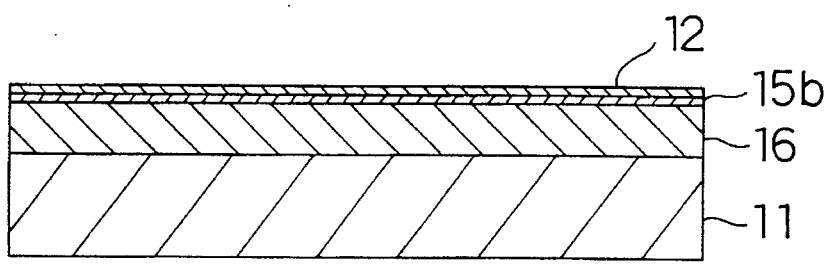
Figure 5D:
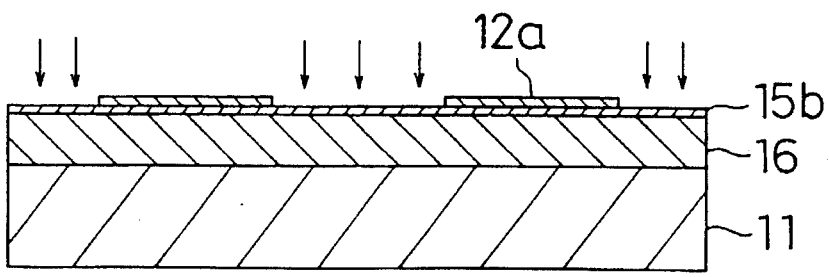

Disposed on the silicon substrate 11 is a BPSG (borophosphosilicate glass) film 16, which is a film of $SiO_2$ containing phosphorus and boron (see FIG. 5(a)). This is followed by the deposition of the TiN film 15b (see FIG. 5(b)).

The TiN film 15b is spin-coated with, for example, HMDS to form the molecular film 12 on top of the TiN film 15b.

High-energy beams such as electron beams are used to illuminate the molecular film 12 for patterning. The molecular film 12 is very loosely bonded to the TiN film 15b, since they are bonded together mostly by physical adsorption. Because of this, illuminated portions of the molecular film 12 are removed (see FIG. 5(d)).

Figure 5E:
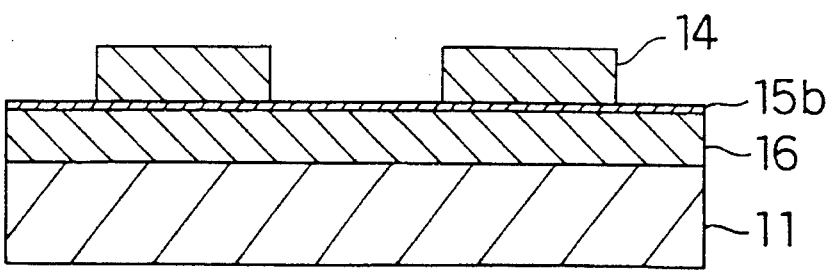

A gas of $WF_6$ reacts with the remaining molecular film 12, which is indicated by reference numeral 12a in the figure, and the tungsten film 14 is selectively formed by a selective CVD process on the silicon substrate 11 (see FIG. 5(e)). In other words, no tungsten films 14 are deposited where the TiN film 15b is exposed. In this way, the thin tungsten film 14 can be formed with a desired pattern.

In the present example, the molecular film 12 is pattern formed using electron beams. High-energy light beams or high-energy thermal beams may be used.

EXAMPLE 6

FIGS. 6(a) to 6(e) describe a semiconductor device fabrication technique employing aluminum wiring. The present example is based on the same technical approach as the first example. In the present example, aluminum wiring 13' is formed on the silicon substrate 11 (see FIG. 6(e)).

Figure 6A:
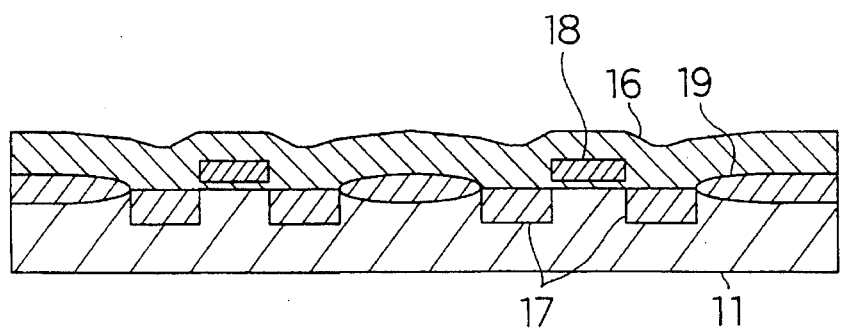
FIGS. 6(a) to 6(e) are schematic cross sectional views, illustrating the steps in the fabrication of a semiconductor device according to a sixth example of the present invention.

As shown in FIG. 6(a), the source/drain diffusion region 17 is formed in the silicon substrate 11. Following the formation of the diffusion region 17, a gate electrode 18, a LOCOS isolation film 19, and a BPSG film 16, which is a planarized silicate insulating film, are formed one after another.

Figure 6B:
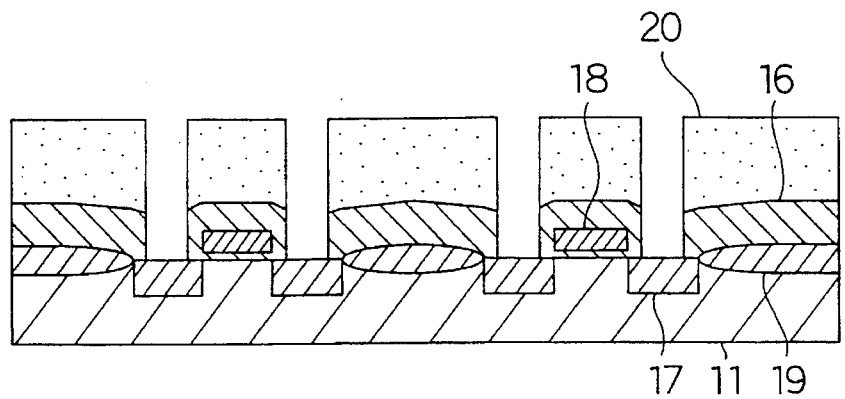

Next, as shown in FIG. 6(b), a required contact pattern is defined with the help of a photoresist 20, and the BPSG film 16 is etched by a dry etching process.

The photoresist 20, then, is removed. HMDS is vaporized. The HMDS vapor is made to react with the above-described samples under the following parameters shown in Table 1 so as to form the molecular film 12 (see FIG. 6(c)).

TABLE 1

| Temp. | HMDS Flow Rate | Pressure | Time |
| --- | --- | --- | --- |
| 130° C. | 5 sccm | 1 atm | 5 minutes |

Figure 6C:
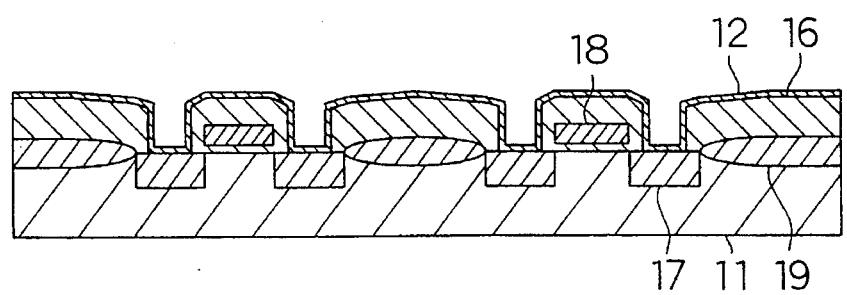
Figure 6D:
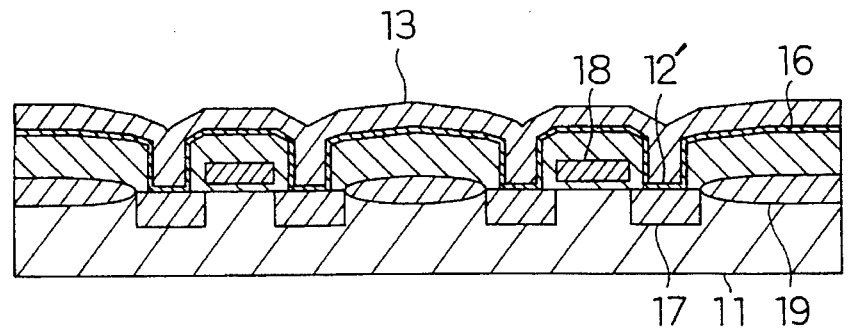
Figure 6E:
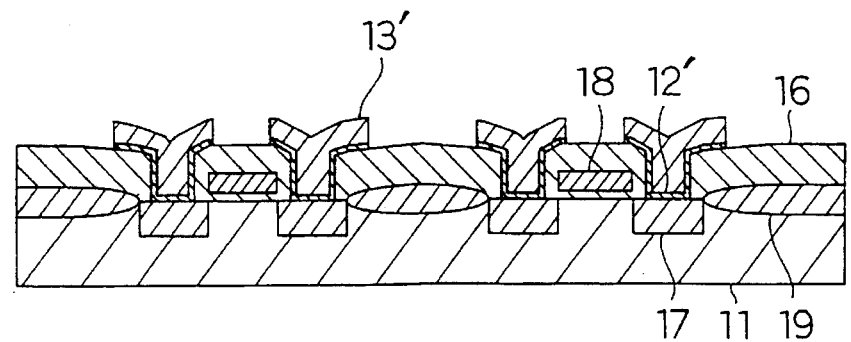

Next, as shown in FIG. 6(d), an aluminum film 13 is deposited by a sputtering process. As a result, the $SiO_xC_yH_z$ film 12', which is transformed from the molecular film 12, is left between the aluminum film 13 and the silicon substrate 11. The aluminum film 13 is processed into a required metallization pattern to form the aluminum wiring 13'.

Semiconductor devices of the present example were checked for the presence or absence of depressions indicative of aluminum spiking. First, the semiconductor devices were heat treated at a temperature of 450° C. for one hour. Next, the aluminum wiring 13' was removed using phosphoric acid. Contacts, exposed by the removal of the aluminum wiring 13', were examined using an optical microscope or scanning electron microscope to check for depressions formed by aluminum spiking in the silicon substrate 11. Table 2 shows the observation results.

TABLE 2

| | Prior Art | Present Invention |
| --- | --- | --- |
| Check for Depressions | Found | Not Found |

It was confirmed that spiking-free contacts had been formed in the case of the present invention.

FIRST MODIFICATION OF EXAMPLE 6

The same technical approach as Examples 2 to 4 may find applications in cases where a tungsten film is formed by a blanket CVD process. The steps of FIG. 6(a) to 6(c) are carried out in the same way as in Example 6. In this modification, however, at a step corresponding to the step of FIG. 6(d), a tungsten film, instead of the aluminum film 13, is deposited using a blanket CVD process. This prevents encroachment/wormholes from occurring at the silicon-tungsten interface.

Conventionally, the deposition of tungsten films on an insulating film by a blanket CVD process is carried out as follows. In the first place, the nuclear growth of tungsten (i.e., the growth of a very thin film or island-like nuclear) takes place by a first mixture of $WF_6$ and $SiH_4$ gases or by a mixture of $WF_6$, $SiH_4$ and $H_2$ gases. Then, the first mixture is replaced by a mixture of $WF_6$ and $H_2$ gases for hydrogen reduction so as to form a tungsten film. The reason for such a replacement is that tungsten films, formed by a mixture of $WF_6$ and $SiH_4$ or by a mixture of $WF_6$, $SiH_4$ and $H_2$ (silane reduction gas), have a high resistivity and an unconformal step coverage due to involving gas-phase reactions. Therefore, following the tungsten nuclear growth, a mixture of $WF_6$ and $H_2$ is used to form a tungsten film conventionally.

If a mixture of $WF_6$ and $H_2$ gases is introduced after a silicon-containing molecular film is formed on an insulating film, this causes the silicon in the molecular film to react with the $WF_6$ gas. This makes it possible to deposit a tungsten film on the entire surface of an insulating film without involving the nuclear growth of tungsten.

A conventional technique and the present example were compared with each other in terms of film formation uniformity. This was done using two different silicon substrates having a diameter of 6 inches prepared by the conventional technique and the present example respectively. Table 3 shows the comparison results.

TABLE 3

|  | Prior Art | Present Invention |
| --- | --- | --- |
| Check for Film Formation Uniformity | Poor | Good |

As seen from Table 3, it was confirmed that spiking-free contacts had been formed in the case of the present invention.

SECOND MODIFICATION OF EXAMPLE 6

The same technical approach as Examples 2 to 4 may find applications in cases where tungsten wiring is formed on aluminum wiring that is arranged on the silicon substrate 11. The problem to be solved at this point in such a process is not the occurrence of encroachment/wormholes but the unwanted formation of Al-F alloy that is a product of the reaction of $WF_6$ with aluminum. The Al-F alloy, since it has a high resistivity, causes electric connection failure at a contact portion. If the same technical approach as Examples 2 to 4 is applied to the connection structure between metal wires, then, the foregoing drawback can be canceled.

EXAMPLE 7

Referring now to FIGS. 7(a) to 7(e), a semiconductor device fabrication method is described in which a tungsten film is selectively deposited.

Figure 7A:
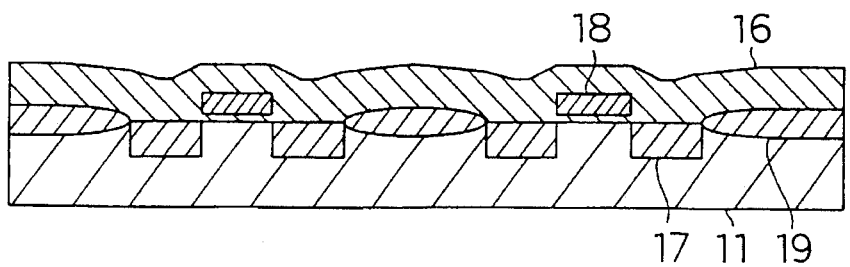
FIGS. 7(a) to 7(e) are schematic cross sectional views, illustrating the steps in the fabrication of a semiconductor device according to a seventh example of the present invention.

As shown in FIG. 7(a), the source/drain diffusion region 17 is formed in the silicon substrate 11. Following the formation of the diffusion region 17, the gate electrode 18, the LOCOS isolation film 19, and the BPSG film 16, which is a planarized silicate insulating film, are formed one after another.

Figure 7B:
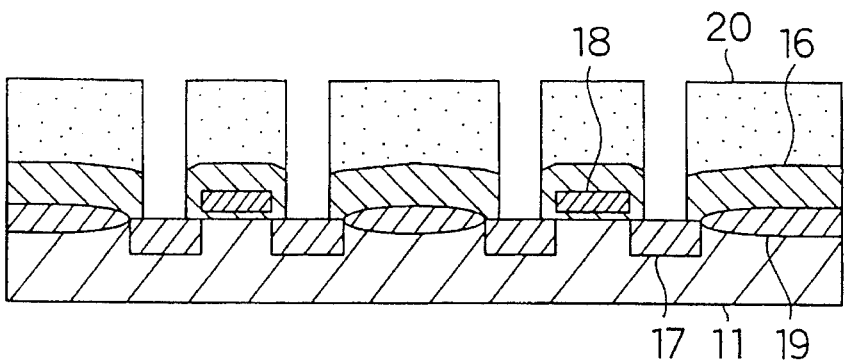

Next, as shown in FIG. 7(b), a required contact pattern is defined with the help of the photoresist 20, and the BPSG film 16 is etched by a dry etching process.

Figure 7C:
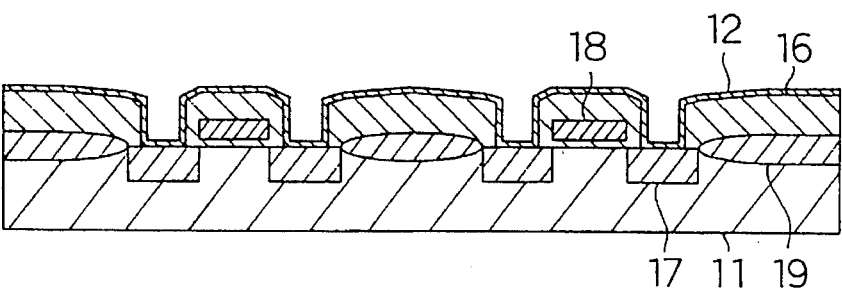

After removal of the photoresist 20, the molecular film 12 is formed using HMDS (see FIG. 7(c)). Then, high-energy beams such as electron beams are used to illuminate the molecular film 12 for patterning. Illuminated parts of the molecular film 12 are removed to expose the silicon in the silicon substrate 11, therefore to open a contact hole.

Figure 7D:
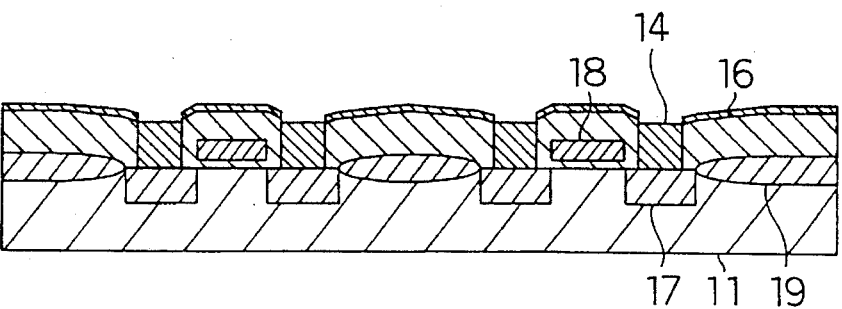

The contact hole is filled with the tungsten film 17 formed by hydrogen reduction or silane reduction (see FIG. 7(d)). The remainder of the molecular film 12 is washed away from above the BPSG film 16.

Figure 7E:
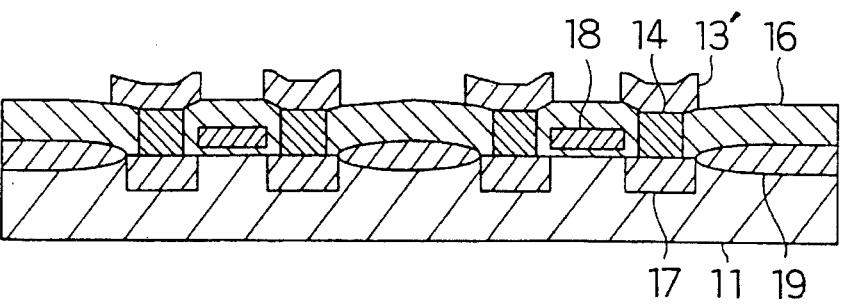

Next, as shown in FIG. 7(e), the aluminum wiring 13', comprised of a single film of an aluminum type alloy or comprised of a lamination film of a metal with a high melting point and an aluminum type alloy, is formed by a sputtering process or patterning process. Semiconductor devices according to the present example were cross-sectionally examined using a scanning electron microscope to check for encroachment/wormholes. Table 4 shows the examination results.

TABLE 4

|  | Prior Art | Present Invention |
| --- | --- | --- |
| Check for Encroachment or Wormholes | Existence | Nonexistence |

As seen from Table 4, it was confirmed that encroachment/wormhole-free contacts were obtained in the case of the present example.

MODIFICATION OF EXAMPLE 7

The same technical approach as Example 7 may find applications in cases where tungsten wiring is selectively deposited on aluminum wiring arranged on the silicon substrate 11. The problem to be solved at this point in such a process is not the occurrence of encroachment/wormholes but the unwanted formation of Al-F alloy that is a product of the reaction of $WF_6$ with aluminum. The Al-F alloy, since it has a high resistivity, causes electric connection failure at a contact portion. If the same technical approach as Example 7 is applied to the connection structure between metal wires, then, the foregoing drawback can be canceled.

EXAMPLE 8

Figure 8A:
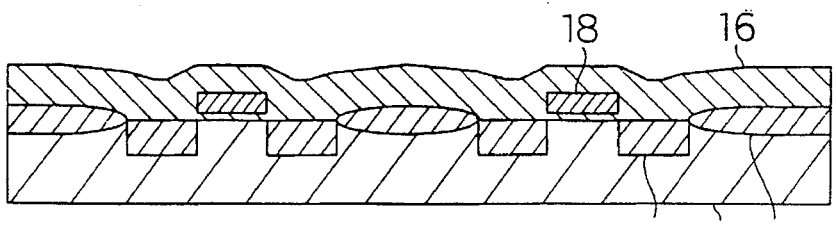
FIGS. 8(a) to 8(f) are schematic cross sectional views, illustrating the steps in the fabrication of a semiconductor device according to an eighth example of the present invention.
Figure 8B:
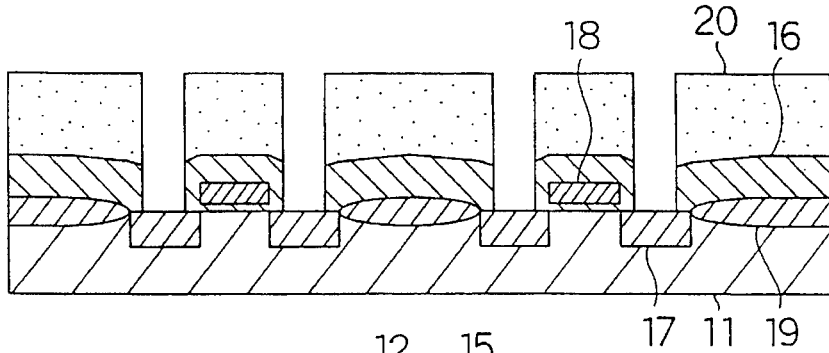

Referring now to FIGS. 8(a) to 8(b), a semiconductor device fabrication method of the present invention is described in which a tungsten film is formed using a blanket CVD process.

As shown in FIG. 8(a), the source/drain diffusion region 17 is formed in the silicon substrate 11. Following the formation of the diffusion region 17, the gate electrode 18, the LOCOS isolation film 19, and the BPSG film 16, which is a planarized silicate insulating film, are formed one after another.

Next, as shown in FIG. 8(b), a required contact pattern is defined with the help of the photoresist 20, and the BPSG film 16 is etched by a dry etching process.

Figure 8C:
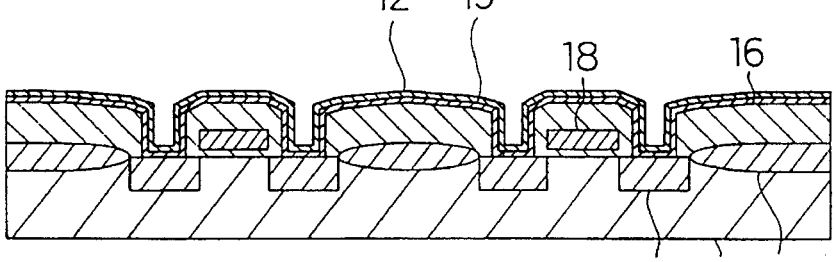

After removal of the photoresist 20, a Ti and a TiN film are deposited 15 nanometers and 100 nanometers, respectively, by a sputtering process so as to form a barrier film 15 (see FIG. 8(c)).

Figure 8D:
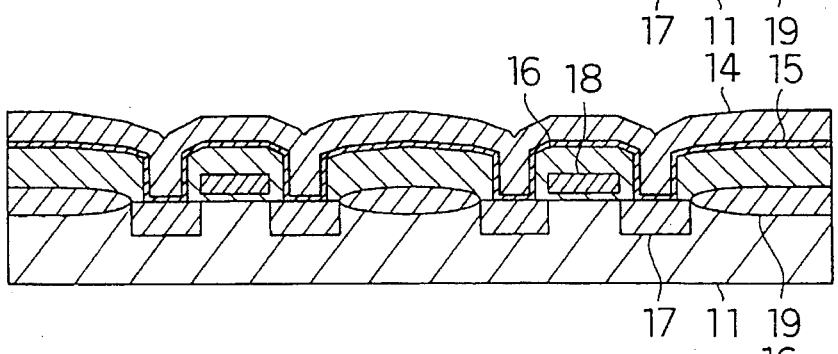
Figure 8E:
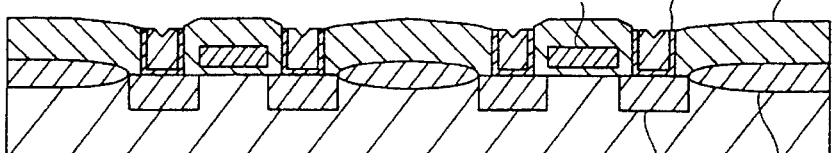

Next, the molecular film 12 is formed on the barrier film 15 by making use of HMDS, after which the tungsten film 14 is formed on top of the barrier film 15 by means of hydrogen reduction or silane reduction (see FIG. 8(d)). Next, as shown in FIG. 8(e), the tungsten film 14 is dry-etched in such a way that it is selectively left only in a contact hole.

Figure 8F:
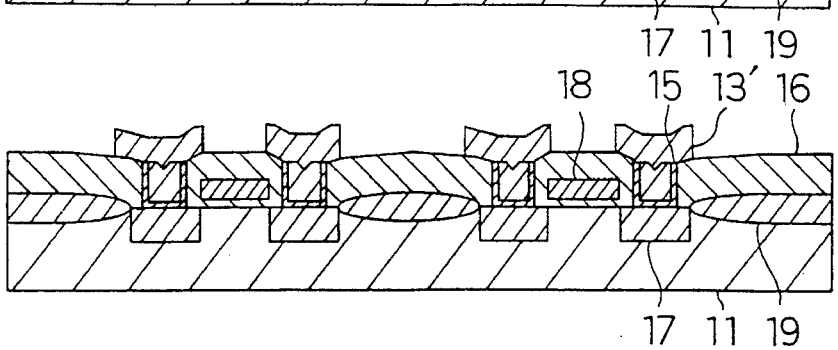

As shown in FIG. 8(f), the metal wiring 13', comprised of a single film of an aluminum type alloy or comprised of a lamination film of a metal having a high melting point and an aluminum type alloy, is formed by a sputtering process or patterning process. Semiconductor devices thus fabricated were checked for the presence or absence of encroachment/ wormholes by contact sizes (aspect ratio). The results are shown in Table 5.

TABLE 5

| Checking for Encroachment/Wormhole | | | | | |
| --- | --- | --- | --- | --- | --- |
| Aspect Ratio | 1 | 2 | 2.5 | 3 | 3.5 |
| Prior Art | o | o | o | ● | ● |
| Invention | o | o | o | o | o |

Notes:
● = Existence;
o = Nonexistence

As seen from Table 5, it was confirmed that encroachment/wormhole-free contacts had been formed in the case of the present example.

In the present example, the Ti/TiN lamination film acts a barrier film. A single Ti or TiN film may be used as a barrier film independently. Also, any other metal having a high-melting point may be used with the same effects.

MODIFICATION OF EXAMPLE 8

The same technical approach as Example 8 may find applications in cases where tungsten wiring is selectively deposited on aluminum wiring arranged on the silicon substrate 11. The problem to be solved at this point in such a process is not the occurrence of encroachment/wormholes but the unwanted formation of Al-F alloy that is a product of the reaction of $WF_6$ with aluminum. The Al-F alloy, since it has a high resistivity, causes electric connection failure at a contact portion. If the same technical approach as Example 8 is applied to the connection structure between metal wiring, then, the foregoing drawback can be canceled.

In each example, the molecular film 12 is formed with the help of HMDS. Other functionally equivalent surface-active agents such as silane, disilazane, trisilazane, piperazine, aminogermanium, and germanium halide compounds may be useful.

Further, in each example, the molecular film 12 is formed by means of gas-phase/solid-phase interface reaction. Direct application of monomolecural film formation materials of liquid state may be possible. It is to be understood that the formation of the molecular film 12 may take place on any other surface other than the wiring surface.

The invention claimed is:

1. A method of fabricating a semiconductor device, comprising the steps of:

depositing a first metal film on a semiconductor substrate forming a molecular film composed of a silicon compound selected from the group consisting of silane, disilazane, and trisilazane on said first metal film;

patterning said molecular film by illuminating said molecular film with high-energy beams; and depositing a second metal film on said patterned molecular film;

wherein said second metal film deposition step includes: supplying a gas containing a second metal over said semiconductor substrate, and chemically reacting said second metal in said gas with said patterned molecular film so that said second metal film is deposited on only said patterned molecular film.

2. The method of claim 1, wherein said second metal is tungsten.

3. A method of fabricating a semiconductor device, comprising the steps of:

forming an insulating film on a semiconductor substrate composed of a silicon;

forming an opening in said insulating film by etching a part of said insulating film, thereby exposing a corresponding part of said semiconductor substrate;

forming a molecular film composed of a compound selected from a group consisting of piperazine, aminogermanium, and germanium halide that reacts with a hydroxyl group generated on said exposed part of said semiconductor substrate at said opening; and depositing a metal film on said molecular film.

4. The method of claim 3, wherein said metal film deposition step includes: supplying a gas containing a metallic compound; and chemically reacting an element, joined to a metal in said metallic compound, with the silicon in said molecular film so as to deposit said metal film composed of said metal on said exposed part of said semiconductor substrate at said opening.

5. The method of claim 3, wherein said metal film is composed of aluminum.

6. The method of claim 3, wherein said metal film is composed of tungsten.

7. A method of fabricating a semiconductor device comprising the steps of:

forming metal wiring on a semiconductor substrate, forming an insulating film on said metal wiring, forming an opening in said insulating film by etching a part of said insulating film, thereby exposing a corresponding part of said metal wiring at said opening, forming a molecular film composed of a silicon compound selected from the group consisting of disilazane and trisilazane on said semiconductor substrate on said exposed part of said metal wiring at said opening, and depositing a metal film on said exposed part of said metal wiring at said opening by supplying a gas containing a metallic compound of said metal film to said opening, and by chemically reacting an element, joined to said metal film, with the silicon in said molecular film.

8. The method of claim 7, wherein said metal wiring is aluminum.

9. The method of claim 7, wherein said metal wiring is tungsten.

10. A method of fabricating a semiconductor device comprising the steps of:

forming metal wiring on a semiconductor substrate, forming an insulating film on said metal wiring, forming an opening in said insulating film by etching a part of said insulating film, thereby exposing a corresponding part of said metal wiring at said opening, depositing a first metal film on said exposed part of said metal wiring at said opening, forming a molecular film composed of a silicon compound selected from the group consisting of disilazane and trisilazane on said semiconductor substrate on said first metal film, and depositing a second metal film on said first metal film by supplying a gas containing a metallic compound of said second metal film to said opening, and by chemically reacting an element, joined to said second metal film, with the silicon in said molecular film.

11. The method of claim 10, wherein said metal wiring is aluminum.

12. The method of claim 10, wherein said first metal film is titanium or titanium nitride.

13. The method of claim 10, wherein said second metal film is tungsten.

* * * * *